(12) United States Patent
Takemura et al.

(10) Patent No.: US 11,067,600 B2
(45) Date of Patent: Jul. 20, 2021

(54) MULTILAYER CIRCUIT BOARD USED FOR PROBE CARD AND PROBE CARD INCLUDING MULTILAYER CIRCUIT BOARD

(71) Applicant: Murata Manufacturing Co., Ltd., Kyoto (JP)

(72) Inventors: Tadaji Takemura, Kyoto (JP); Hiromichi Kawakami, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 322 days.

(21) Appl. No.: 16/114,458

(22) Filed: Aug. 28, 2018

(65) Prior Publication Data

US 2018/0364280 A1 Dec. 20, 2018

Related U.S. Application Data

(63) Continuation of application No. PCT/JP2017/006049, filed on Feb. 20, 2017.

(30) Foreign Application Priority Data

Mar. 3, 2016 (JP) .............................. JP2016-040950

(51) Int. Cl.
*G01R 1/073* (2006.01)
*H05K 1/02* (2006.01)
(Continued)

(52) U.S. Cl.
CPC ........ *G01R 1/073* (2013.01); *H01L 23/49822* (2013.01); *H01L 23/49827* (2013.01);
(Continued)

(58) Field of Classification Search
CPC ............................ G01R 1/073; G01R 1/07314
See application file for complete search history.

(56) References Cited

U.S. PATENT DOCUMENTS 7,102,367 B2 * 9/2006 Yamagishi ......... G01R 1/07378
324/754.07
7,501,839 B2 * 3/2009 Chan .................. G01R 1/06711
324/754.18
(Continued)

FOREIGN PATENT DOCUMENTS

CN 201188722 Y 1/2009
JP 2000-299559 A 10/2000
(Continued)

OTHER PUBLICATIONS

Chinese Office action for 201780014320.4 dated Jun. 8, 2020.
(Continued)

*Primary Examiner* — Walter L Lindsay, Jr.
*Assistant Examiner* — Milton Gonzalez
(74) *Attorney, Agent, or Firm* — Pearne & Gordon LLP

(57) ABSTRACT

A multilayer circuit board 3a includes a core substrate 7; a resin section 8, which covers the side surface and a lower surface 12 of the core substrate 7; and a plurality of metal pins 11, which are disposed within the resin section 8. The core substrate 7 includes a ceramic multilayer section 9, which is disposed on the mother-substrate side of the core substrate 7; and a resin multilayer section 10, which is stacked on a main surface 13 on a side of the ceramic multilayer section 9, the side being opposite to the mother substrate. The resin section 8 includes the plurality of metal pins 11, and a through-hole 22, which extends through the resin section 8 in its thickness direction. A fastening part 24 penetrates the through-hole 22, to mount the multilayer circuit board 3a on the mother substrate.

13 Claims, 8 Drawing Sheets

(51) Int. Cl.
*H01L 23/498* (2006.01)
*H05K 1/03* (2006.01)
*H05K 3/46* (2006.01)
*H01L 23/15* (2006.01)

(52) U.S. Cl.
CPC ......... *H05K 1/0268* (2013.01); *H05K 1/0271* (2013.01); *H05K 1/0298* (2013.01); *H05K 1/0306* (2013.01); *H05K 3/4688* (2013.01); *H01L 23/15* (2013.01); *H01L 2924/15174* (2013.01); *H05K 2201/068* (2013.01); *H05K 2201/096* (2013.01); *H05K 2201/10409* (2013.01)

(56) References Cited

U.S. PATENT DOCUMENTS

| | | | | |
|---|---|---|---|---|
| 8,263,874 | B2* | 9/2012 | Hashimoto | H05K 3/4605 |
| | | | | 174/258 |
| 9,326,378 | B2* | 4/2016 | Hashimoto | H05K 1/0306 |
| 2007/0009718 | A1 | 1/2007 | Kanda | |
| 2007/0222465 | A1* | 9/2007 | Huang | G01R 3/00 |
| | | | | 324/756.03 |
| 2009/0051041 | A1* | 2/2009 | Otsuka | H05K 3/4617 |
| | | | | 257/774 |
| 2010/0117673 | A1 | 5/2010 | Lee et al. | |
| 2011/0168439 | A1* | 7/2011 | Chang | H05K 3/4629 |
| | | | | 174/264 |

FOREIGN PATENT DOCUMENTS

| | | |
|---|---|---|
| JP | 2004-228103 A | 8/2004 |
| JP | 2007-019198 A | 1/2007 |
| JP | 2009-222597 A | 10/2009 |
| JP | 2011-108959 A | 6/2011 |
| JP | 2011-228427 A | 11/2011 |

OTHER PUBLICATIONS

International Search Report for International Application No. PCT/JP2017/006049, dated Apr. 11, 2017.
Witten Opinion for International Application No. PCT/JP2017/006049, dated Apr. 11, 2017.

* cited by examiner

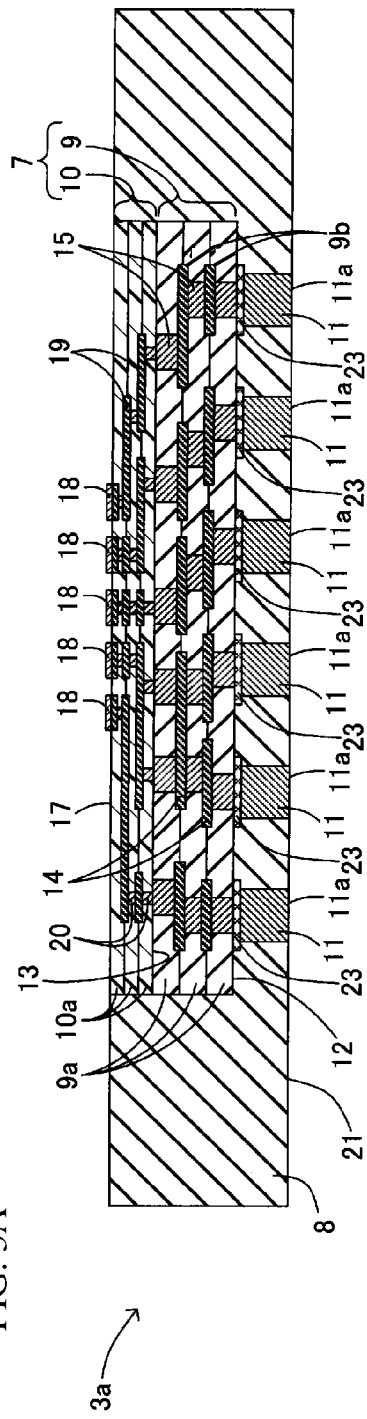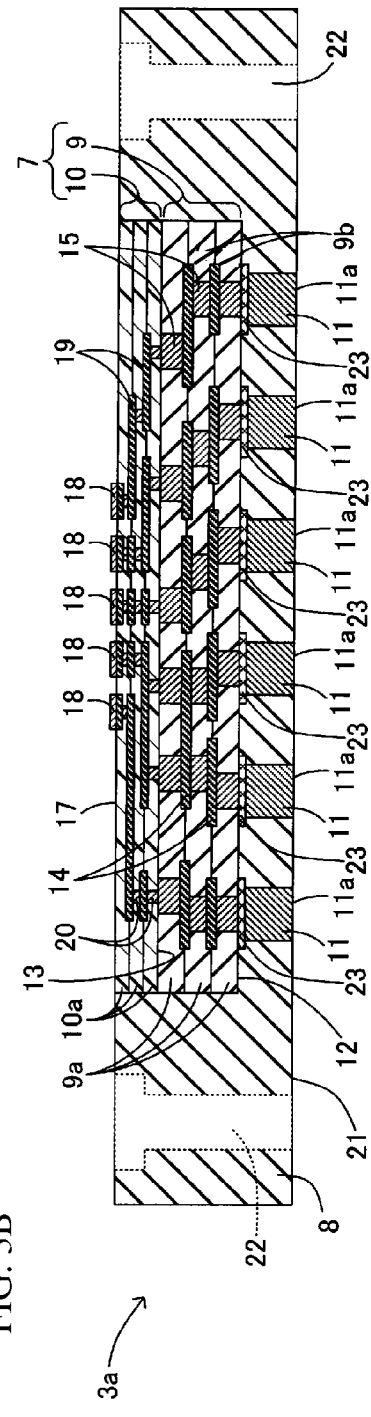

-- PRIOR ART --

MULTILAYER CIRCUIT BOARD USED FOR PROBE CARD AND PROBE CARD INCLUDING MULTILAYER CIRCUIT BOARD

This is a continuation of International Application No. PCT/JP2017/006049 filed on Feb. 20, 2017 which claims priority from Japanese Patent Application No. 2016-040950 filed on Mar. 3, 2016. The contents of these applications are incorporated herein by reference in their entireties.

FIELD OF THE DISCLOSURE

The present disclosure relates to a multilayer circuit board including a ceramic layer, and a probe card including the multilayer circuit board.

DESCRIPTION OF THE RELATED ART

In existing probe cards used for electrical testing for semiconductor devices, in order to provide the redistribution wiring between the probe pins and the mother substrates, multilayer circuit boards are used. Among such multilayer circuit boards, there is a multilayer circuit board that includes a ceramic multilayer section formed by stacking a plurality of ceramic layers.

For example, as illustrated in FIG. 8, a ceramic circuit board 100 described in Patent Document 1 includes a ceramic layer 101, which is formed by stacking a plurality of ceramic insulating layers 101a, and a resin layer 102, which is formed by stacking a plurality of insulating resin layers 102a, wherein the resin layer 102 is stacked on the ceramic layer 101. In the resin layer 102, the insulating resin layers 102a and wiring layers 103 are alternately stacked, and wiring layers 103 disposed over and under an insulating resin layer 102a are connected together by using a via conductor 104. An electrical connection is established between a via conductor 104 formed in the lowermost insulating resin layer 102a and an end portion of an inner wiring 105, the end portion being exposed at the upper surface of the ceramic circuit board 100.

In this case, on the upper surface of the ceramic layer 101, a protrusion portion 109 is formed so as to separately surround the connection portion between a via conductor 104 and an inner wiring 105. The protrusion portion 109 is formed of a material having a higher Young's modulus than the resin forming the insulating resin layer 102a.

In such a circuit board, the connection portion between the via conductor 104 and the end portion of the inner wiring 105 is protected by the protrusion portion 109, which surrounds the connection portion and has a high Young's modulus. Thus, thermal stress applied to the connection portion is reduced due to the protrusion portion 109, which provides a highly reliable circuit board with a reduced possibility of disconnection.

Patent Document 1: Japanese Unexamined Patent Application Publication No. 2011-108959 (refer to Paragraphs 0027 to 0030, FIG. 1, and the like)

BRIEF SUMMARY OF THE DISCLOSURE

However, it is difficult to process ceramic substrates. For example, when a ceramic substrate for a probe card is processed for adjusting the size, defects such as chipping may occur. Such a ceramic substrate may be required to have a thickness of about several millimeters. However, the larger the thickness of the ceramic substrate is, the higher the risk of the occurrence of the defects during processing is. In addition, since the processing for adjusting the size is performed at a step close to the final step, it is difficult to repair defects caused by the processing in such a step, which is problematic.

The present disclosure has been made from the viewpoint of such problems. An object is to provide a multilayer circuit board used for a probe card and including a core substrate including a ceramic layer in which the side surface of the core substrate is covered with resin, to thereby reduce the occurrence of the defects such as chipping during processing for the outer shape or processing of forming a hole.

In order to achieve the object, a multilayer circuit board used for a probe card according to the present disclosure is provided as a multilayer circuit board that is used for a probe card and to which a plurality of probe pins are connected, the multilayer circuit board including a core substrate including a ceramic multilayer section formed by stacking a plurality of ceramic layers, and having one main surface to which the plurality of probe pins are connected; and a resin section disposed so as to cover a side surface of the core substrate.

In this configuration, the side surface of the core substrate is covered with resin, so that processing such as formation of a hole or cutting of the outer shape can be performed not on the core substrate but on the resin section. As a result, the occurrence of the problematic defects such as chipping during the processing of the core substrate can be reduced. In addition, even when defects due to processing occur, the use of resin enables the processing to be easily performed again. In addition, since the side surface of the core substrate is covered with the resin section, a reduction in the size of the core substrate can be achieved without changing the size of the multilayer circuit board, which enables a reduction in the production costs.

For the core substrate, the resin section may further cover another main surface of the core substrate, and a columnar conductor may be further included that is disposed in a portion of the resin section, the portion covering the other main surface of the core substrate, that is electrically connected to each of the plurality of probe pins, and that has one end surface exposed at a surface of the resin section, the surface being opposite to the other main surface of the core substrate.

In this case, the mother substrate-side surface of the multilayer circuit board used for a probe card is covered with resin, so that it has a thermal expansion coefficient close to that of the mother substrate. In addition, the probe pad-side surface is provided as a ceramic substrate, so that it has a thermal expansion coefficient close to that of a semiconductor wafer. As a result, warpage and distortion of the multilayer circuit board due to the heat during the testing using the probe card can be reduced. In addition, the planarity of the substrate, which is important for the multilayer circuit board used for a probe card, can be easily ensured by polishing the resin section. In the case where a portion of the wiring for the core substrate is formed in a portion covering the other main surface of the core substrate, the size of the core substrate can be further reduced, which enables a reduction in the production costs.

A portion of the resin section, the portion covering the side surface of the core substrate, may have a hole portion recessed in a thickness direction. The multilayer circuit board used for a probe card may be subjected to the processing of forming a hole in order to attach a probe head or to fasten the multilayer circuit board to the mother substrate. In the case where the hole portion is formed in the resin section, the processing of the core substrate is no longer necessary, and the occurrence of the defects such as chipping can be prevented. Incidentally, the hole portion may extend through the resin section.

The core substrate may further include a resin multilayer section stacked on a surface of the ceramic multilayer section, the surface being opposite to a resin section-side surface of the ceramic multilayer section, and a surface of the resin multilayer section, the surface being opposite to a resin section-side surface of the resin multilayer section, may serve as the one main surface of the core substrate. In this case, for example, the resin multilayer section may be formed of a resin enabling fine wiring such as polyimide, which facilitates a reduction in the width of wiring. A probe card is repeatedly brought into contact with semiconductor devices tested; stress and impact caused by the contacts can be reduced by forming a resin multilayer section on the ceramic multilayer section, which prevents the deformation of the multilayer circuit board.

The above-described multilayer circuit board is preferably used for a probe card configured to perform electrical testing on a test article. This provides a probe card that has high durability, and has high reliability of connection with the mother substrate.

In the present disclosure, a multilayer circuit board used for a probe card is provided by covering a ceramic substrate with a resin section, so that processing such as formation of a hole or cutting of the outer shape can be performed not on the ceramic substrate but on the resin section. Thus, the use of resin enables re-formation and avoidance of production risks such as chipping due to the processing of the ceramic substrate. In addition, a reduction in the size of the ceramic substrate can be achieved. Thus, a reduction in the production costs of the multilayer circuit board can be achieved.

BRIEF DESCRIPTION OF THE SEVERAL VIEWS OF THE DRAWINGS

FIGS. 3A and 3B illustrate modifications of the multilayer circuit board.

DETAILED DESCRIPTION OF THE DISCLOSURE

First Embodiment

A probe card 1a according to an embodiment of the present disclosure will be described with reference to FIG. 1 and FIG. 2. Incidentally, FIG. 1 is a sectional view of the probe card 1a, and FIG. 2 is a sectional view of a multilayer circuit board 3a mounted in the probe card 1a in FIG. 1.

Figure 1:
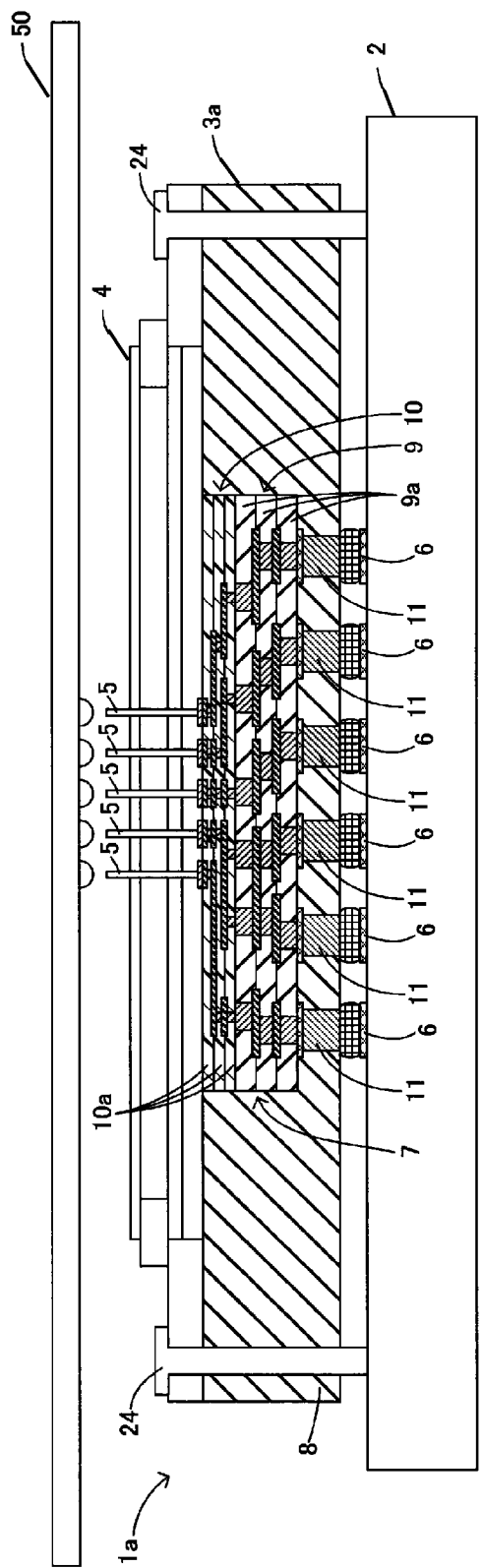
FIG. 1 is a sectional view of a probe card according to a first embodiment of the present disclosure.

As illustrated in FIG. 1, the probe card 1a according to this embodiment includes a mother substrate 2; a multilayer circuit board 3a, which is mounted on one main surface of the mother substrate 2; a plurality of probe pins 5, which have one ends connected to the multilayer circuit board 3a; a probe head 4, which supports the probe pins 5; and a fastening part 24, which fastens the probe head 4 and the multilayer circuit board 3a. The probe card 1a is used for, for example, electrical testing for a test article 50 such as a semiconductor device.

On one main surface of the mother substrate 2, a plurality of mounting electrodes 6 are formed for mounting the multilayer circuit board 3a. Each of the mounting electrodes 6 is connected, via a wiring electrode (not shown) or a plurality of via conductors (not shown) formed within the mother substrate, to the corresponding outer electrode (not shown). The mother substrate 2 is formed of, for example, glass epoxy resin. The probe head 4, which holds the probe pins 5, and the multilayer circuit board 3a are fastened to the mother substrate with fastening parts 24. The fastening parts 24 in this embodiment are formed so as to have a flanged end portion and a T-shape section parallel to the longitudinal direction.

Figure 2:
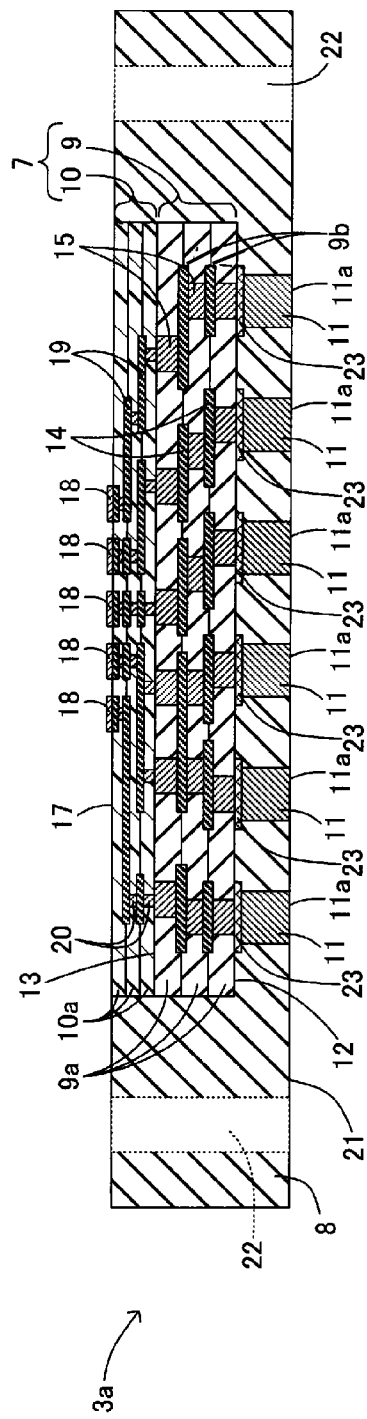
FIG. 2 is a sectional view of a multilayer circuit board used for the probe card in FIG. 1.

As illustrated in FIG. 2, the multilayer circuit board 3a includes a core substrate 7; a resin section 8, which covers the side surface and a lower surface 12 (the mother substrate 2-side main surface, which corresponds to "another main surface of the core substrate" in the present disclosure) of the core substrate 7; and a plurality of metal pins 11 (which correspond to "columnar conductors" in the present disclosure), which are disposed within the resin section 8. The core substrate 7 includes a ceramic multilayer section 9, which is disposed on the mother substrate 2-side thereof; and a resin multilayer section 10, which is stacked on an upper surface 13 (a main surface opposite to the mother substrate 2-side main surface) of the ceramic multilayer section 9. The ceramic multilayer section 9 is formed by alternately stacking ceramic layers 9a and wiring layers 9b. Incidentally, each ceramic layer 9a may be formed of various ceramics; examples of thereof include low temperature co-fired ceramics (LTCC) containing, as a main component, a ceramic containing borosilicate glass (for example, alumina), and high temperature co-fired ceramics (HTCC). In this embodiment, the ceramic multilayer section 9 is constituted by three ceramic layers 9a and two wiring layers 9b. However, the number of these layers can be appropriately changed.

In each wiring layer 9b in the ceramic multilayer section 9, various wiring electrodes 14 are formed. In each ceramic layer 9a, a plurality of via conductors 15 are formed, which connect together wiring electrodes 14 formed in different wiring layers 9b. The wiring electrodes 14 and the via conductors 15 are formed of a metal such as Cu, Ag, or Al. The various wiring electrodes 14 formed in each wiring layer 9b are formed by, for example, screen printing using a conductive paste containing the metal (such as Cu, Ag, or Al).

The resin multilayer section 10 is a multilayer body including a plurality of resin layers 10a, and is stacked on the upper surface 13 of the ceramic multilayer section 9. On an upper surface 17 (the main surface opposite to a surface facing the ceramic multilayer section 9) of the resin multilayer section 10, a plurality of connection electrodes 18, to which the probe pins 5 are connected, are formed. Incidentally, each connection electrode 18 may be constituted by, for example, an underlying electrode formed of Cu or the like, and a surface electrode formed by Ni plating and Au plating over the underlying electrode.

In each resin layer 10a, various wiring electrodes 19 and a plurality of via conductors 20 are formed. In this case, each wiring electrode 19 is formed in the following manner, for example: on a main surface of the resin layer 10a, a Ti film serving as an underlying electrode is formed by sputtering or the like, and a Cu film is similarly formed by sputtering or the like on the Ti film; on the Cu film, another Cu film is formed by electroplating or electroless plating. Incidentally, each wiring electrode 14 formed in the ceramic multilayer section 9 has a thick film pattern because it is formed by screen printing or the like; by contrast, each wiring electrode 19 formed in the resin multilayer section 10 has a thin film pattern because it is formed by sputtering or the like. Each wiring electrode 19 formed in the resin multilayer section 10 is formed so as to have a fine line pattern by photolithographic processing.

The connection electrodes 18 are electrically connected to a plurality of outer electrodes (not shown) formed in the other main surface of the mother substrate 2. Specifically, as illustrated in FIG. 1 and FIG. 2, each connection electrode 18 is connected to the corresponding outer electrode (not shown) via a wiring electrode 19 and a via conductor 20, which are formed in the resin multilayer section 10, a wiring electrode 14 and a via conductor 15 formed in the ceramic multilayer section 9, a wiring electrode (not shown) and a via conductor (not shown) formed in the mother substrate 2, and the like.

The resin section 8 is disposed so as to cover the side surface and the lower surface 12 of the core substrate 7. Stated another way, the core substrate 7 is disposed so as to fit in the recessed portion of the resin section 8. The resin section 8 is formed in this manner, so that the multilayer circuit board 3a can be provided so as to have an appropriate size, and a reduction in the size of the core substrate 7 can be achieved. Furthermore, in order to insert the fastening parts 24 for fastening the multilayer circuit board 3a to the mother substrate 2, through-holes 22 (corresponding to "hole portions" in the present disclosure) are formed in the resin section 8 in its thickness direction.

The resin section 8 is formed of a resin such as epoxy resin. The resin section 8 may be formed by a technique such as coating, printing, transfer molding, or compression molding. An opposite surface 21 of the resin section 8, the opposite surface 21 being opposite to a surface of the resin section 8 facing the core substrate 7, is connected to the mother substrate 2 with solder, for example.

The plurality of metal pins 11 (corresponding to "columnar conductors" in the present disclosure) are disposed in the resin section 8 so as to be joined to a plurality of electrodes 23, which are formed on the lower surface 12, which is on the mother substrate 2-side of the core substrate 7. Thus, the plurality of metal pins 11 are electrically connected via the wiring layers 9b of the core substrate 7 to each of the probe pins 5. Each metal pin 11 may be formed by, for example, shearing a wire rod formed of a metal such as Cu, Ag, or Al. An end surface 11a, which is an exposed portion of each metal pin 11 and is located at the opposite surface 21 of the resin section 8, may be plated. Incidentally, such metal pins are employed in this embodiment; however, instead of the metal pins, via conductors formed from, for example, a conductive paste, or post electrodes may be formed.

A method for producing the multilayer circuit board 3a will be concisely described. The ceramic multilayer section 9 is first formed by alternately stacking the ceramic layers 9a and the wiring layers 9b. On the upper surface of the ceramic multilayer section 9, the resin multilayer section 10 in which the resin layers 10a are stacked is stacked, to form the core substrate 7. On the lower surface 12 of the core substrate 7, the plurality of electrodes 23 are formed. On the electrodes 23, the metal pins 11 are disposed so as to stand. Subsequently, the side surface and the lower surface 12 of the core substrate 7 are covered with resin, and the resin is cured to form the resin section 8. After the resin section 8 is formed, the opposite surface 21 of the resin section 8 is polished in order to expose the heads of the metal pins and ensure planarity. The through-holes 22, through which the fastening parts 24 are inserted, are formed in the resin section 8 in its thickness direction by drilling or laser processing. Finally, cutting with a dicing machine or a laser for adjusting the size is performed, to thereby provide the multilayer circuit board 3a having a predetermined size.

Thus, in the above-described embodiment, the side surface and the lower surface 12 of the core substrate 7 are covered with resin, so that processing for fastening the multilayer circuit board 3a to the mother substrate 2 can be performed not on the core substrate 7 including the ceramic multilayer section 9, but on the resin section 8. Since resin is processed more easily than ceramic, the occurrence of the defects such as chipping during the processing of the ceramic substrate can be reduced. Furthermore, the resin section can be formed again.

The mother substrate 2-side surface of the multilayer circuit board 3a is covered with the resin section 8, and this section can be formed so as to have a thermal expansion coefficient corresponding to the thermal expansion coefficient of the mother substrate 2. With the thermal expansion coefficient thus adjusted to correspond, the occurrence of the warpage or distortion of the multilayer circuit board 3a due to heat during testing can be reduced.

The resin section 8 is thus formed, to thereby achieve a reduction in the size of the core substrate 7 without changing the size of the multilayer circuit board 3a. Ceramic substrates are more expensive than resin substrates. A reduction in the size of the ceramic multilayer section 9 enables an increase in the number of the ceramic multilayer sections 9 obtained from one substrate, which results in a reduction in the production costs.

The resin multilayer section 10 provided in the core substrate 7 facilitates a reduction in the width of wiring, to thereby provide the multilayer circuit board 3a that can perform electrical testing on semiconductor devices having narrow pitches between terminals. The resin section 8 and the resin multilayer section 10 are stacked on the lower surface 12 and the upper surface 13 of the ceramic multilayer section 9, so that the resin section 8 and the resin multilayer section 10 can function as materials that reduce the stress or impact due to the physical contacts during the use of the probe card. This enables a reduction in the deformation and damage of the ceramic multilayer section 9 to enhance the durability of the multilayer circuit board 3a, and enables a reduction in the disconnection of the wiring electrodes 14.

(Modifications of Multilayer Circuit Board)

In the above-described embodiment, the through-holes 22 are formed in the resin section 8 in its thickness direction. However, as illustrated in FIG. 3A, the formation of through-holes may be omitted. In this case, for example, a cover body fixed to the mother substrate 2 may be used to fasten the multilayer circuit board 3a to the mother substrate. In this configuration, for example, in order to fasten the probe head 4 to the multilayer circuit board 3a, blind hole portions (closed-bottomed recess portions) may be formed.

As illustrated in FIG. 3B, the through-holes 22 may have another different shape, from that in FIG. 2. In this case, each through-hole 22 has a T-shape end surface (cross section) parallel to the thickness direction of the multilayer circuit board 3a. As a result, an end portion (flanged portion) of the fastening part 24 can be fit into the through-hole 22.

Figure 4:
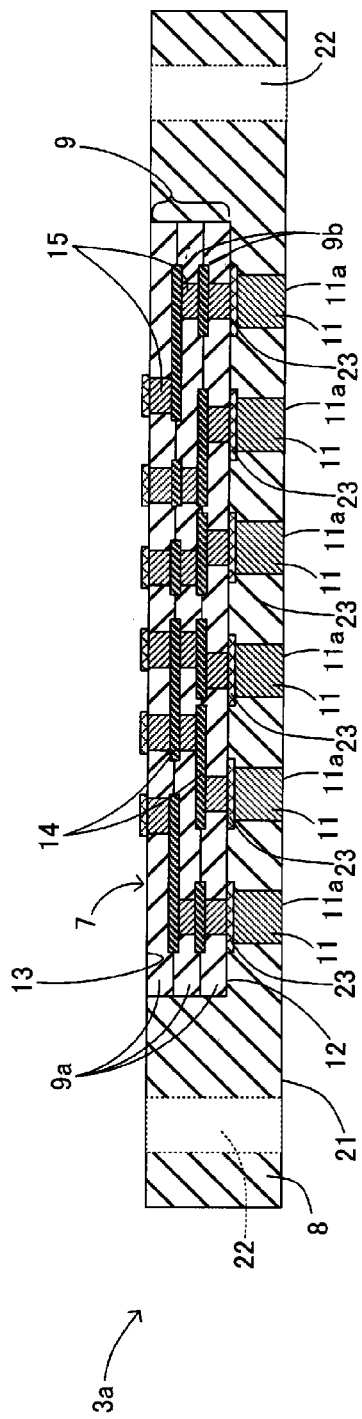
FIG. 4 is a modification of the multilayer circuit board.

As illustrated in FIG. 4, in the above-described multilayer circuit board 3a, the core substrate 7 may be constituted solely by the ceramic multilayer section 9. Thus, the probe pin-side of the core substrate 7 is also constituted by the ceramic multilayer section 9, to ensure the planarity with ease and to achieve a reduction in the distortion or warpage of the multilayer circuit board 3a due to the load.

Second Embodiment

A probe card 1b according to a second embodiment of the present disclosure will be described with reference to FIG. 5 and FIG. 6. Incidentally, FIG. 5 is a sectional view of the probe card 1b; and FIG. 6 is a sectional view of a multilayer circuit board 3b mounted in the probe card 1b.

Figure 5:
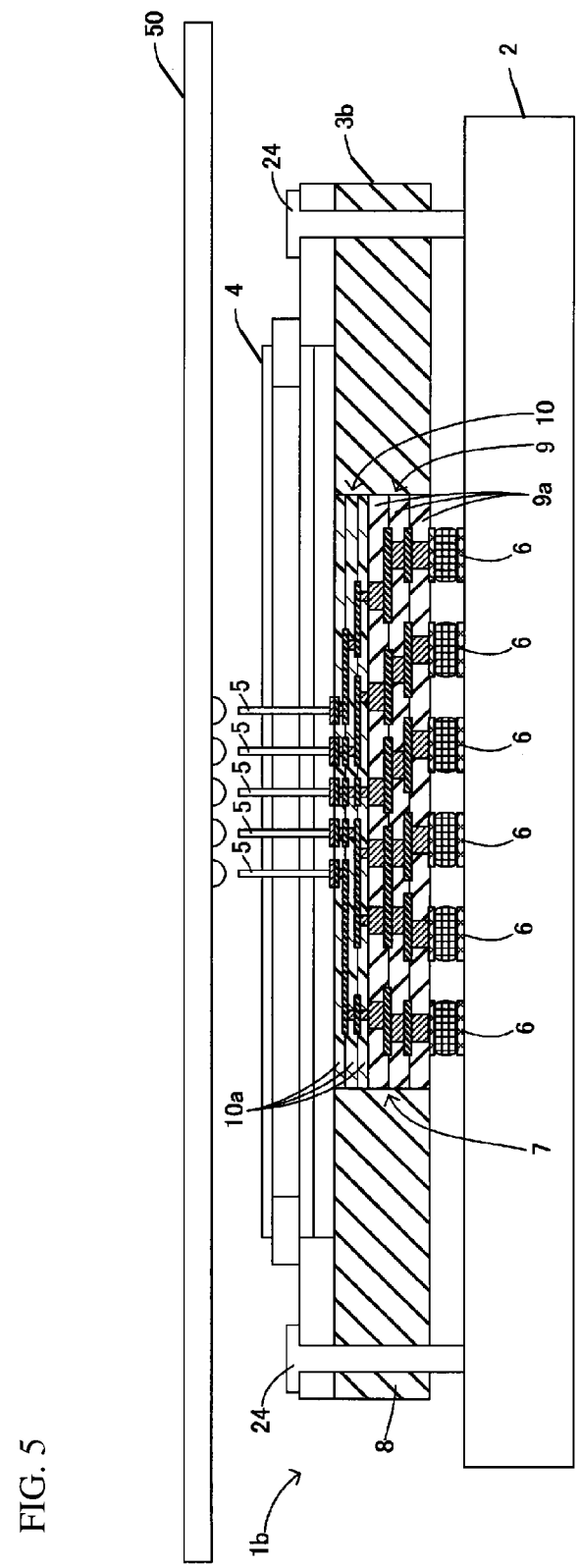
FIG. 5 is a sectional view of a probe card according to a second embodiment of the present disclosure.
Figure 6:
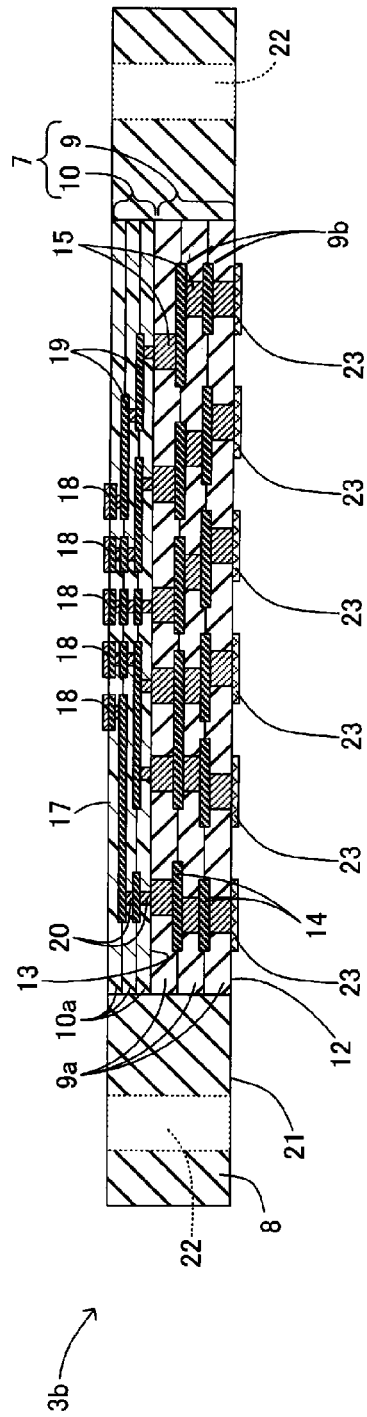
FIG. 6 is a sectional view of a multilayer circuit board used for the probe card in FIG. 5.

The feature of the multilayer circuit board 3b mounted in the probe card 1b according to this embodiment, the feature being different from the first embodiment described with reference to FIG. 1 and FIG. 2, is that, as illustrated in FIG. 5 and FIG. 6, the lower surface 12 of the core substrate 7 is not covered with the resin section 8. The other elements are the same as in the multilayer circuit board 3a in the first embodiment, and hence are denoted by the same reference signs and will not be described.

In this case, the resin section 8 is disposed so as to cover the side surface of the core substrate 7; and through-holes 22 are formed in the resin section 8 in its thickness direction in order to insert fastening parts 24, which are used to fasten the multilayer circuit board 3b to the mother substrate. On an upper surface 17 of the core substrate 7, a plurality of connection electrodes 18, to which probe pins 5 are connected, are disposed; and, on a lower surface 12, a plurality of electrodes 23, which are used to establish electrical connections between the mother substrate 2 and the probe pins 5, are disposed.

This embodiment provides similar advantages as the first embodiment.

(Modification of Multilayer Circuit Board)

Figure 7:
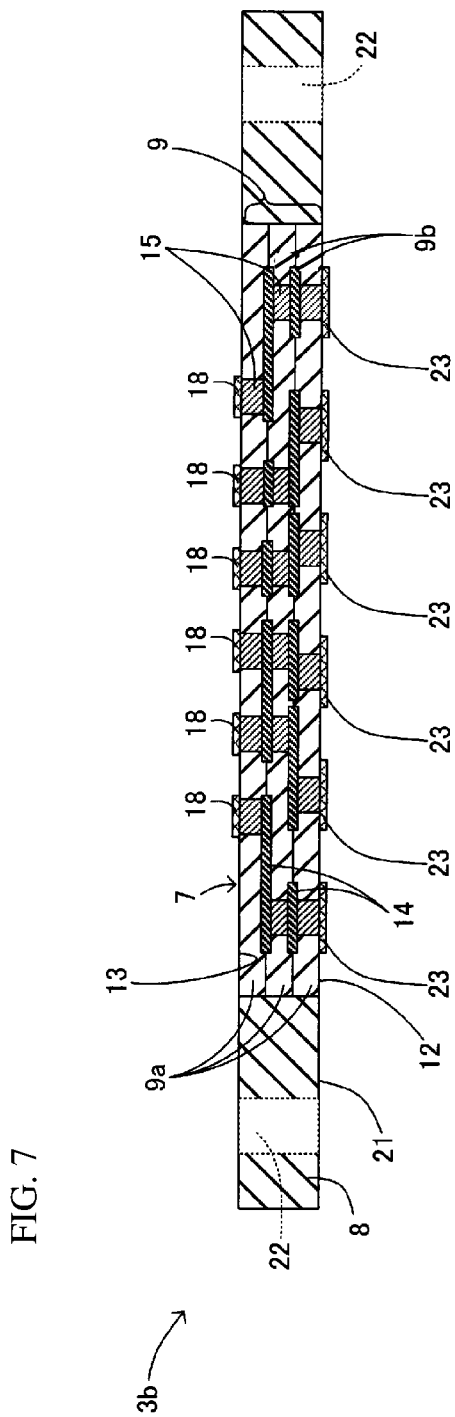
FIG. 7 illustrates a modification of the multilayer circuit board.
Figure 8:
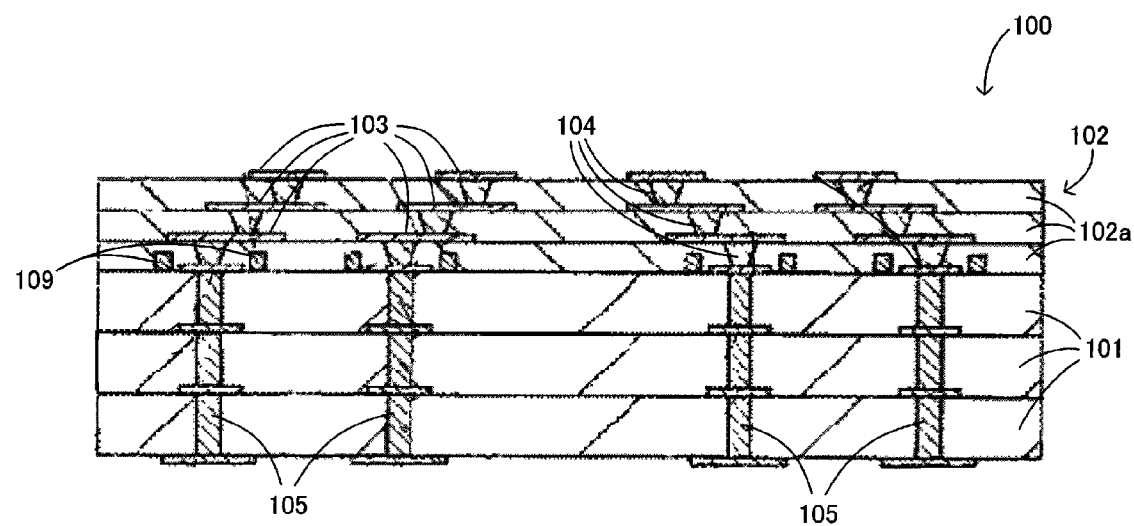
FIG. 8 is a sectional view of an existing multilayer circuit board.

As illustrated in FIG. 7, in the above-described multilayer circuit board 3b, the core substrate 7 may be solely constituted by the ceramic multilayer section 9. Thus, the probe pin-side of the core substrate 7 is also constituted by the ceramic multilayer section 9, to ensure the planarity with ease, and to achieve a reduction in distortion or warpage of the multilayer circuit board 3b due to the load.

Incidentally, the present disclosure is not limited to the above-described embodiments and the embodiments can be further modified in various ways without departing from the spirit and scope of the present disclosure. For example, some features of the embodiments and the modifications may be combined.

The present disclosure is widely applicable to various probe cards used for electrical testing for test articles, and multilayer circuit boards used for probe cards.

1a, 1b probe cards
3a, 3b multilayer circuit boards
5 probe pin
7 core substrate
8 resin section
9 ceramic multilayer section
9a ceramic layer
10 resin multilayer section
10a resin layer
11 metal pin (columnar conductor)
22 through-hole (hole portion)

The invention claimed is:

1. A multilayer circuit board used for a probe card and having a plurality of probe pins connected, the multilayer circuit board comprising:
 a core substrate including a ceramic multilayer section having a plurality of stacked ceramic layers, wherein the plurality of probe pins are connected to one main surface of the core substrate; and
 a resin section disposed so as to cover an entire side surface of the ceramic multilayer section.

2. The multilayer circuit board used for a probe card according to claim 1, wherein the resin section further covers another main surface of the core substrate,
 the multilayer circuit board further comprising a columnar conductor disposed in a portion of the resin section, the portion covering the other main surface of the core substrate, wherein the columnar conductor is electrically connected to each of the plurality of probe pins, and has one end surface exposed at a surface of the resin section, the surface being opposite to the other main surface of the core substrate.

3. The multilayer circuit board used for a probe card according to claim 2, wherein a portion of the resin section covering the side surface of the core substrate has a hole portion recessed in a thickness direction.

4. The multilayer circuit board used for a probe card according to claim 2, wherein the core substrate further includes a resin multilayer section stacked on a surface of the ceramic multilayer section, the surface being opposite to a resin section-side surface of the ceramic multilayer section, and
 a surface of the resin multilayer section opposite to a resin section-side surface of the resin multilayer section serves as the one main surface of the core substrate.

5. A probe card comprising the multilayer circuit board used for a probe card according to claim 2, the probe card being configured to perform electrical testing on a test article.

6. The multilayer circuit board used for a probe card according to claim 1, wherein a portion of the resin section covering the side surface of the core substrate has a hole portion recessed in a thickness direction.

7. The multilayer circuit board used for a probe card according to claim 6, wherein the core substrate further includes a resin multilayer section stacked on a surface of the ceramic multilayer section, the surface being opposite to a resin section-side surface of the ceramic multilayer section, and
 a surface of the resin multilayer section opposite to a resin section-side surface of the resin multilayer section serves as the one main surface of the core substrate.

8. A probe card comprising the multilayer circuit board used for a probe card according to claim 6, the probe card being configured to perform electrical testing on a test article.

9. The multilayer circuit board used for a probe card according to claim 1, wherein the core substrate further includes a resin multilayer section stacked on a surface of the ceramic multilayer section, the surface being opposite to a resin section-side surface of the ceramic multilayer section, and
 a surface of the resin multilayer section opposite to a resin section-side surface of the resin multilayer section serves as the one main surface of the core substrate.

10. A probe card comprising the multilayer circuit board used for a probe card according to claim 9, the probe card being configured to perform electrical testing on a test article.

11. The multilayer circuit board used for a probe card according to claim 9, wherein the resin section further covers a side surface of the resin multilayer section.

12. A probe card comprising the multilayer circuit board used for a probe card according to claim 1, the probe card being configured to perform electrical testing on a test article.

13. The multilayer circuit board used for a probe card according to claim 1, wherein the ceramic multilayer section further has a plurality of stacked wiring layers, and wherein the plurality of stacked ceramic layers and the plurality of stacked wiring layers are alternately stacked.

\* \* \* \* \*